United States Patent [19]

Jaskolski et al.

[11] Patent Number: 4,516,144
[45] Date of Patent: May 7, 1985

[54] COLUMNATED AND TRIMMED MAGNETICALLY SENSITIVE SEMICONDUCTOR

[75] Inventors: Stanley V. Jaskolski, Sussex; Herman P. Schutten, Milwaukee; Gordon B. Spellman, Mequon; Jan K. Sedivy, Elm Grove; Maurice W. Jensen, Greendale, all of Wis.

[73] Assignee: Eaton Corporation, Cleveland, Ohio

[21] Appl. No.: 421,942

[22] Filed: Sep. 23, 1982

[51] Int. Cl.$^3$ ...................... H01L 27/22; H03K 17/90
[52] U.S. Cl. ......................................... 357/27; 307/309
[58] Field of Search ........................... 357/27; 307/309

[56] References Cited

U.S. PATENT DOCUMENTS 3,668,439  6/1972  Fujikawa et al. .
4,129,880 12/1978  Vinal ..................................... 357/27

OTHER PUBLICATIONS

"The Magnetic Field Sensitive Transistor-A New Sensor for Crankshaft Angle Position", Halbo and Heraldsen, Sensors for Automotive Systems, Society of Automotive Engineers, SP-458 Congress & Exposition Cobo Hall, Detroit, Feb. 25–29, 1980.

Primary Examiner—Martin H. Edlow
Assistant Examiner—Terri M. Henn
Attorney, Agent, or Firm—Andrus, Sceales, Starke & Sawall

[57] ABSTRACT

A Hall effect semiconductor device is provided with means for clipping or focusing emitted carriers to form a centralized columnated beam, and trimming means for accurately controlling the amount of magnetic deflection due to Lorentz force. Emitters from an emitter region travel through a base region under influence of an externally applied drift field toward a pair of spaced collector regions. The polarity of a perpendicularly applied magnetic field determines deflection of the carriers toward one or the other of the collector regions. The columnating means comprises a pair of spaced auxiliary collector regions intermediate the emitter region and the primary collector regions for collecting carriers not within a central angle or cone. A columnated beam is provided by carriers passing between the auxiliary collectors within the central angle or cone. Trimming of the beam is provided by a selectable electric field applied in the same direction as deflection of the carriers to thus control the amount of beam deflection and insure that the beam is directed toward the one or other primary collector.

6 Claims, 2 Drawing Figures

COLUMNATED AND TRIMMED MAGNETICALLY SENSITIVE SEMICONDUCTOR

BACKGROUND AND SUMMARY

The invention relates to Hall effect semiconductor devices wherein current carriers in the substrate are deflected by the Lorentz force of a perpendicularly applied magnetic field.

In one type of known device, carriers from an emitter region travel through a base region toward one or the other of a pair of spaced collector regions. The carriers are deflected toward one or the other of the collector regions according to the polarity of a perpendicularly applied magnetic field. An electric drift field is applied through the base region to enhance carrier movement from the emitter region towards the collector regions. Examples of this type of device are shown in "The Magnetic Field Sensitive Transistor—A New Sensor for Crankshaft Angle Position", Halbo and Heraldsen, Sensors for Automotive Systems, Society of Automotive Engineers, SP-458, Congress and Exposition Cobo Hall, Detroit, Feb. 25–29, 1980; and Fujikawa et al U.S. Pat. No. 3,668,439.

The present invention provides improvements to the above noted device, including columnating means and trimmer means. The columnating means is between the emitter region and the collector regions and columnates the emitted carriers to a centralized beam to be deflected by the magnetic field. The trimmer means provides accurate fine tuning control of the amount of deflection of the carrier beam, to insure that the beam is directed toward the one or the other collector region.

In preferred form, the columnating means comprises a pair of spaced auxiliary collector regions intermediate the emitter region and the primary collector regions. Carriers emitted from the emitter region outside of a given central angle or cone are collected by the auxiliary collectors and do not reach the primary collectors. Carriers emitted from the emitter region within the given central angle cone pass between the auxiliary collector regions and reach the primary collectors, thus affording a centralized columnated beam of carriers to be deflected by the magnetic field. The trimmer means applies a selectable electric field perpendicular to the carrier beam and along the same direction as deflection of carriers, to thus electrically control the amount of deflection and insure that the carrier beam reaches the one or other primary collector region.

DETAILED DESCRIPTION

Figure 1:
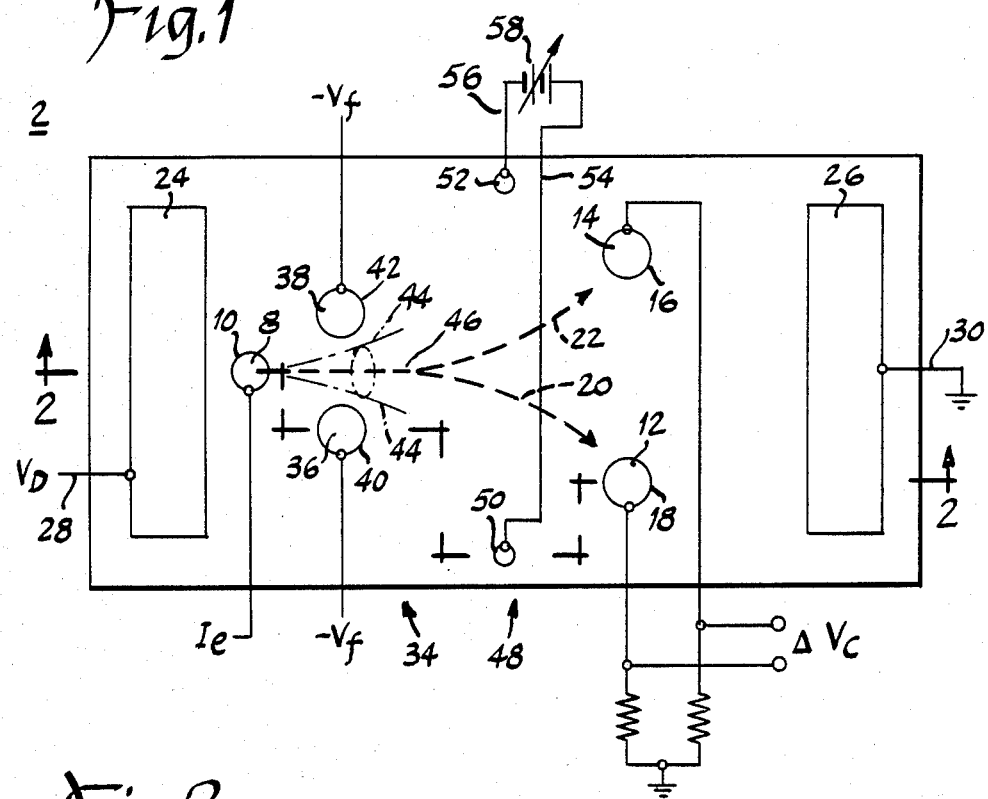
FIG. 1 is a schematic top view of a semiconductor device constructed in accordance with the invention.
Figure 2:
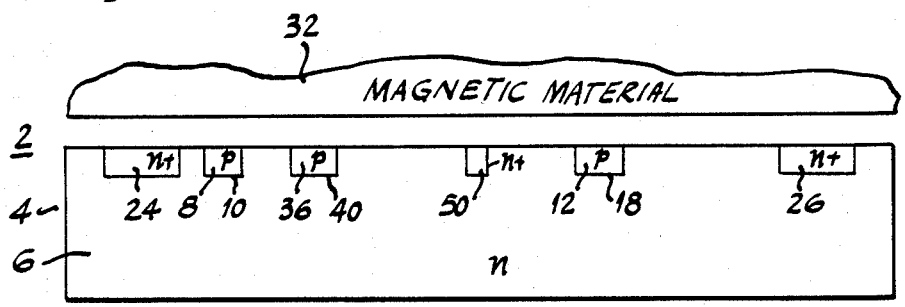
FIG. 2 is a cross-sectional view taken along line 2—2 of FIG. 1.

There is shown in FIGS. 1 and 2 a magnetically sensitive semiconductor device 2 formed in a substrate 4 including a base region 6 of one conductivity type such as n type. A p type emitter region 8 forms a junction 10 with the base region. A pair of spaced p type primary collector regions 12 and 14 form junctions 16 and 18 with the base region.

Means are provided for applying an electric drift field through the base region enhancing carrier movement from emitter region 8 towards one or the other collector region as shown by the two dashed paths 20 and 22.

The means for applying an electric drift field includes n+ regions 24 and 26 to facilitate connection of electrodes 28 and 30 between a voltage source $v_d$ and ground. Emitter region 8 is connected to a source of emitter current $I_e$, and holes emitted from emitter region 8 move rightwardly through base region 6, which movement is enhanced by the electric drift field in the base between regions 24 and 26.

Means such as magnet 32 is provided for applying a magnetic field normal to the page as seen in FIG. 1, and downwardly as seen in FIG. 2. As is known, the magnetic field causes deflection of the carrier holes due to the Lorentz force. Depending on the polarity of the magnetic field, the carriers will be deflected along path 20 toward collector 12 or along path 22 toward collector 14. The holes are collected in collector regions 12 and 14, and the differential voltage thereacross $\Delta V_c$ gives a measure of the deflection, and thus the strength of the magnetic field. The device thus far described is well known in the art as above noted.

The present invention provides means for focusing and columnating the carriers to afford a centralized carrier beam, and means for accurately electrically controlling the amount of deflection of the beam due to the magnetic field.

Columnating means 34 is provided between emitter region 8 and the primary collector regions 12 and 14 for columnating the carriers emitted from emitter region 8. Columnating means 34 comprises a pair of spaced auxiliary p type collector regions 36 and 38 forming junctions 40 and 42 with base region 6. Junctions 40 and 42 are reverse biased by voltage supply $-V_f$. Carriers emitted from emitter region 8 within a given central angle or cone 44 pass between auxiliary collector regions 36 and 38 and reach the first mentioned primary collector regions 12 and 14. Carrier holes emitted from emitter region 8 outside of central cone 44 are collected by auxiliary collector regions 36 and 38 and do not reach the first mentioned primary collector regions 12 and 14. A centralized columnated beam of carrier holes 46 is thus provided for deflection by the magnetic field. There is thus provided a shaped and focused beam of carriers. The closer the auxiliary collectors 36 and 38, the narrower the beam 46.

Trimmer means 48 is provided between emitter region 8 and the primary collector regions 12 and 16, and preferably between columnating means 34 and collector regions 12 and 14. Trimmer means 48 includes n+ regions 50 and 52 connected by electrodes 54 and 56 across a variable voltage supply 58 for applying a selectable electric field through base region 6 perpendicular to carrier beam 46 and in the same direction as deflection of the carriers. This electric field between regions 50 and 52 provides accurate fine tuning control of the amount of deflection along paths 20 or 22 to insure that the carrier beam is directed toward the one or other collector region 12 or 14 at the desired magnetic field strength.

One particularly desirable application of the invention is in semiconductor magnetic memories. A magnetic field of one polarity deflects the carrier beam to one collector region 12, while the opposite polarity magnetic field deflects the carrier beam to the other collector region 14, thus providing a two state binary logic output. The columnating and trimming afforded by the invention enhance accuracy and reliability.

It is recognized that various modifications are possible within the scope of the appended claims.

We claim:

1. In a magnetically sensitive semiconductor device comprising a substrate including a base region of one conductivity type, an emitter region of opposite conductivity type forming a junction with said base region, a pair of spaced collector regions of said opposite conductivity type each forming a junction with said base region, and means for applying a magnetic field to deflect carriers from said emitter region toward one or the other of said collector regions, the improvement comprising columnating means between said emitter region and said collector regions for columnating the carriers emitted from said emitter region, said columnating means comprising a pair of spaced auxiliary collector regions of said opposite conductivity type each forming a junction with said base region such that carriers emitted from said emitter region outside a given central angle or cone are collected by said auxiliary collector regions and do not reach said first mentioned collector regions, and such that carriers emitted from said emitter region within said central angle or cone pass between said auxiliary collector regions and reach said first mentioned collector regions, whereby to afford a centralized columnated beam of carriers to be deflected by said magnetic field.

2. In a magnetically sensitive semiconductor device comprising a substrate including a base region of one conductivity type, an emitter region of opposite conductivity type forming a junction with said base region, a pair of spaced collector regions of said opposite conductivity type each forming a junction with said base region, and means for applying a magnetic field to deflect carriers from said emitter regions toward one or the other of said collector regions, the improvement comprising trimmer means between said emitter region and said collector regions and applying a selectable electric field along the same direction as said deflection of carriers, for accurately controlling the amount of carrier deflection and directing said carriers toward said one or other collector region.

3. The invention according to claim 2 including means for applying an electric drift field through said base region enhancing carrier movement from said emitter region towards said collector regions, and wherein said selectable electric field is perpendicular to said electric drift field.

4. A magnetically sensitive semiconductor device, comprising:

a substrate including a base region of one conductivity type;

an emitter region of opposite conductivity type forming a junction with said base region;

a pair of spaced collector regions of said opposite conductivity type each forming a junction with said base region;

means for applying a magnetic field to deflect carriers toward one or the other of said collector regions;

columnating means between said emitter region and said collector regions for columnating the carriers emitted from said emitter region; and trimmer means between said emitter region and said collecror regions and applying a selectable electric field along the same direction as said deflection of carriers, to accurately control the amount of carrier deflection.

5. The invention according to claim 4 comprising means for applying an electric drift field through said base region enhancing carrier movement from said emitter region towards said collector regions, said selectable electric field being perpendicular to said electric drift field, and wherein said trimmer means is between said columnating means and said collector regions to provide fine tuned controlled deflection of the columnated carrier beam toward said one or other collector region.

6. The invention according to claim 5 wherein said columnating means comprises a pair of spaced auxiliary collector regions of said opposite conductivity type each forming a junction with said base region such that carriers emitted from said emitter region within a given central angle or cone are collected by said auxiliary collector regions and do not reach said first mentioned collector regions, and such that carriers emitted from said emitter region within said central angle or cone pass between said auxiliary collector regions and reach said first mentioned collector regions, whereby to afford a centralized columnated beam of carriers to be deflected by said magnetic field and controlled by said trimmer means.

* * * * *